(12) United States Patent
Karda et al.

(10) Patent No.: US 12,740,098 B2
(45) Date of Patent: Sep. 15, 2026

(54) TRANSISTORS WITH MITIGATED FREE BODY EFFECT

(71) Applicant: Micron Technology, Inc., Boise, ID (US)

(72) Inventors: Kamal M. Karda, Boise, ID (US); Anthony J. Kanago, Boise, ID (US); Haitao Liu, Boise, ID (US); Si-Woo Lee, Boise, ID (US); Soichi Sugiura, Bristow, VA (US)

(73) Assignee: Micron Technology, Inc., Boise, ID (US)

( * ) Notice: Subject to any disclaimer, the term of this patent is extended or adjusted under 35 U.S.C. 154(b) by 473 days.

(21) Appl. No.: 18/237,206

(22) Filed: Aug. 23, 2023

(65) Prior Publication Data

US 2024/0072174 A1 Feb. 29, 2024

Related U.S. Application Data

(60) Provisional application No. 63/373,887, filed on Aug. 30, 2022.

(51) Int. Cl.
*H10D 30/67* (2025.01)
*H10B 12/00* (2023.01)

(52) U.S. Cl.
CPC ......... *H10D 30/6711* (2025.01); *H10B 12/05* (2023.02); *H10B 12/315* (2023.02); *H10D 30/6728* (2025.01)

(58) Field of Classification Search
CPC .............. H10B 12/315; H10B 12/0383; H10D 30/6728
See application file for complete search history.

(56) References Cited

U.S. PATENT DOCUMENTS 8,878,271 B2 11/2014 Karda et al.
2020/0286906 A1* 9/2020 Karda .................... H10B 12/05

* cited by examiner

*Primary Examiner* — Errol V Fernandes
(74) *Attorney, Agent, or Firm* — Schwegman Lundberg & Woessner, P.A.

(57) ABSTRACT

A variety of applications can include an apparatus having an electronic device including a number of transistors in a pair-wise arrangement that can address a floating body effect associated with the type of transistor implemented in the pair-wise arrangement. The transistors can be structured as thin film transistors having one-gate separated by a gate dielectric from a vertical channel structure. The pair-wise arrangement can include a conductive shield between a channel structure of a transistor of the pair and a channel structure of the other transistor of the other pair. A conductive body can be located below the conductive shield and shorted to the conductive shield, where the conductive body contacts the channel structures of the transistors of the pair-wise arrangement. The conductive shield can be coupled to node to be set at a constant voltage in operation.

20 Claims, 12 Drawing Sheets

TRANSISTORS WITH MITIGATED FREE BODY EFFECT

PRIORITY APPLICATION

This application claims the benefit of priority to U.S. Provisional Application Ser. No. 63/373,887, filed Aug. 30, 2022, which is incorporated herein by reference in its entirety.

FIELD OF THE DISCLOSURE

Embodiments of the disclosure relate generally to electronic devices and, more specifically, to transistors and formation thereof.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), static RAM (SRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others. Properties of memory devices and other electronic devices can be improved by enhancements to the design and fabrication of components of the electronic devices such as components of memory devices.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
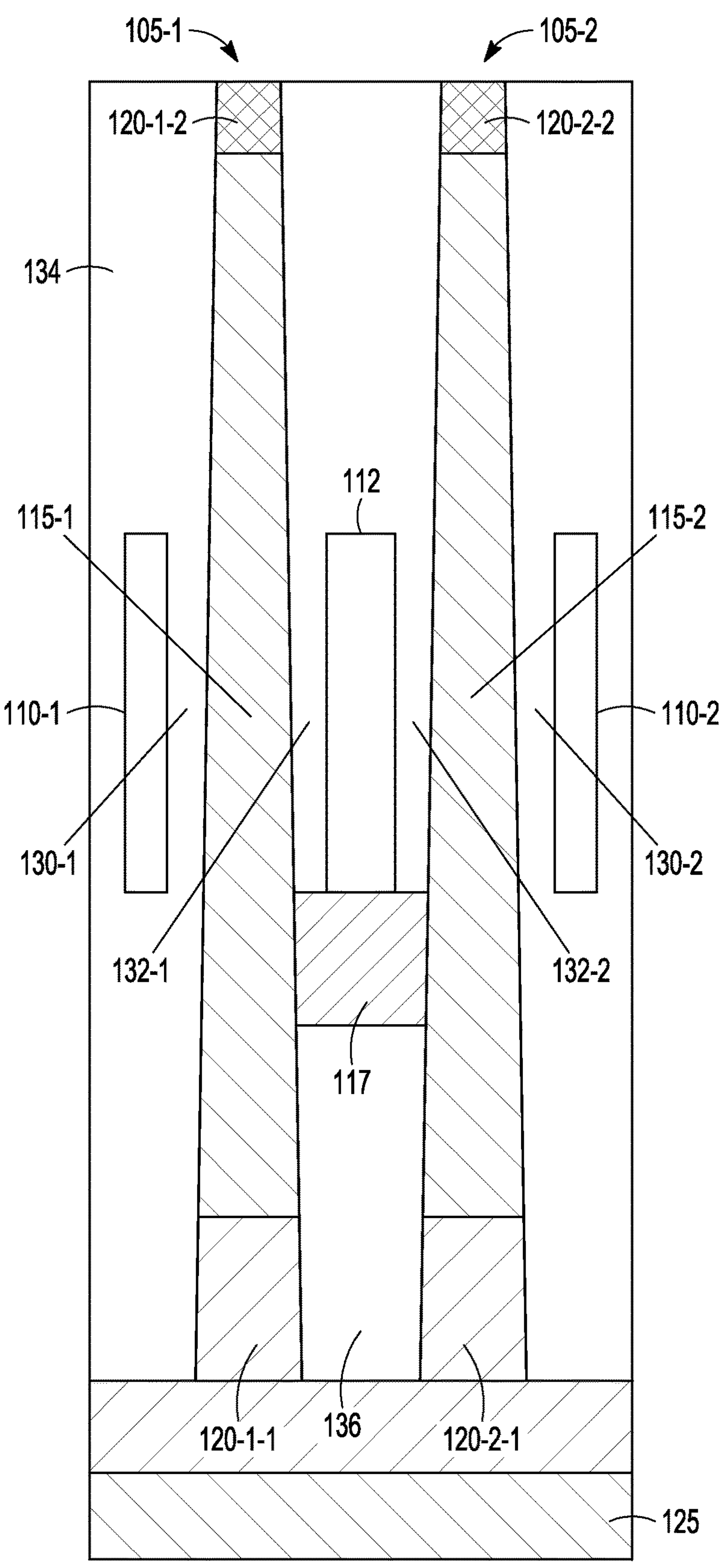
FIG. 1 illustrates a cross-sectional representation of an example of two vertical transistors with a body contact structured between and contacting the two vertical transistors, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The term "horizontal" as used in this application is defined as a plane parallel to a conventional plane or surface of a wafer or substrate, regardless of the orientation of the wafer or substrate. The term "vertical" refers to a direction perpendicular to the horizontal as defined above. Various features can have a vertical component to the direction of their structure. The various embodiments are not necessarily mutually exclusive, as some embodiments can be combined with one or more other embodiments to form new embodiments. The following detailed description is, therefore, not to be taken in a limiting sense.

As complexity and capacity criteria increase, components of electronic devices are being scaled down in size. To increase storage capacity, sizes of memory cells are being reduced. For example, DRAM devices are increasing in memory capacity with reduced memory cell size or other design considerations. However, DRAM device scaling can become difficult. One option, to address reducing cell size, can include using a vertical channel of a single-gate transistor as an access device in each memory cell. The memory cell can be structured as the access device coupled to a storage cell, where the storage cell can be a capacitor. The capacitor can be realized in a number of different formats. The transistor can be structured as a thin film transistor (TFT). TFTs are a class of metal-oxide-semiconductor field-effect transistors (MOSFETs).

There are some challenges associated with using a TFT with a vertical channel structure as an access device of a memory cell. Such a TFT having a vertical channel has no substrate body contact, which can lead to free body effects (FBEs) that can degrade retention. Additionally, a TFT having no body contact, as an access device, can put a constraint on the junction of the TFT that is on the data line side of the TFT and on the junction of the TFT that is on the storage cell side of the TFT, which can impact the current, $I_{ON}$, where $I_{ON}$ is the on-state current of the transistor. The current, $I_{OFF}$, is the off-state current of the transistor. A n-channel MOSFET, for example, is in the off-state when the voltage between the gate and the source of the MOSFET ($V_{gs}$) is less than the threshold voltage ($V_t$). The subthreshold current, when $V_{gs}<V_t$, is a main contributor to $I_{OFF}$. Measured $I_{OFF}$ is the drain current ($I_d$) measured at $V_{gs}=0$ with the voltage between the drain and the source ($V_{gs}$) at the level of the supply voltage. The ratio, $I_{ON}/I_{OFF}$, is a figure of merit for high performance and low leakage power for the transistor. High performance is associated with more $I_{ON}$ and low leakage power is associated with less $I_{OFF}$. Eliminating or significantly reducing sub-surface conduction can improve the $I_{ON}/I_{OFF}$ ratio.

In various embodiments, a single-gate device in a memory array can include a body contact that can mitigate $I_{off}$ problems associated with a FBE. The single-gate device can be structured with a design that also also boosts $I_{on}$, while improving $I_{off}$, as the junction of the data line side of the single gate device can be engineered for higher doping, where the body contact is not in the path of $I_{on}$.

FIG. 1 illustrates a cross-sectional representation of an embodiment of an example of two vertical transistors 105-1 and 105-2 with a body contact 117 structured between and contacting the two vertical transistors 105-1 and 105-2. Each of transistor 105-1 and transistor 105-2 can be structured as a TFT. Transistor 105-1 can include a source/drain region 120-1-1 and a source/drain region 120-1-2 at opposite ends of a vertical pillar. Source/drain region 120-1-1 is at the bottom of the pillar and source/drain region 120-1-2 is at the top of the pillar. Source/drain region 120-1-1 and source/drain region 120-1-2 are highly doped regions relative to the material of the pillar between source/drain region 120-1-1 and source/drain region 120-1-2. The region of the pillar between source/drain region 120-1-1 and source/drain region 120-1-2 provides a channel structure 115-1 for transistor 105-1. Gate 110-1 is separated from channel structure 115-1 by a gate dielectric 130-1.

Gate 110-1 can have a metallic composition. A metallic composition is a composition of one or more elemental metals or a composition of two or more elements such that the composition has electrical properties of a metal. A metallic composition can be structured having one or more elemental metals and one or more non-metal elements. The metallic composition can include one or more metals such as, but not limited to, tungsten or ruthenium. The metallic composition can include, but is not limited to, one or more of titanium nitride or a metal silicide. The doping in the pillar can decrease from source/drain region 120-1-1 to a region opposite gate 110-1 of transistor 105-1 and then increase towards source/drain region 120-1-2. With source/drain region 120-1-1 and source/drain region 120-1-2 doped n-type, the pillar can include doped p-type material. The pillar can include, but is not limited to, silicon, polysilicon, or silicon germanium. Source/drain region 120-1-1 is situated above a conductive region 125, which can be a metal line for communication such as current flow with an electronic device coupled to source/drain region 120-1-2. There can be a region between source/drain region 120-1-1 and conductive region 125, where such a region can be a highly doped region to provide a conduction path, with relatively low resistance, between source/drain region 120-1-1 and conductive region 125. Conductive region 125 can include one or more of tungsten, ruthenium, titanium nitride, a metal silicide, or other metallic composition.

Transistor 105-2 can include a source/drain region 120-2-1 and a source/drain region 120-2-2 at opposite ends of a vertical pillar. Source/drain region 120-2-1 is at the bottom of the pillar and source/drain region 120-2-2 is at the top of the pillar. Source/drain region 120-2-1 and source/drain region 120-2-2 are highly doped regions relative to the material of the pillar between source/drain region 120-2-1 and source/drain region 120-2-2. The region of the pillar between source/drain region 120-2-1 and source/drain region 120-2-2 provides a channel structure 115-2 for transistor 105-2. Gate 110-2 is separated from channel structure 115-2 by a gate dielectric 130-2.

Gate 110-2 can have a metallic composition. The metallic composition can include one or more metals such as, but not limited to, tungsten or ruthenium. The metallic composition can include, but is not limited to, one or more of titanium nitride or a metal silicide. The doping in the pillar can decrease from source/drain region 120-2-1 to a region opposite gate 110-2 of transistor 105-2 and then increase towards source/drain region 120-2-2. With source/drain region 120-2-1 and source/drain region 120-2-2 doped n-type, the pillar can include doped p-type material. The pillar can include, but is not limited to, silicon, polysilicon, or silicon germanium. Source/drain region 120-2-1 is situated above conductive region 125, which can be a metal line for communication such as current flow with an electronic device coupled to source/drain region 120-2-2. There can be a region between source/drain region 120-2-1 and conductive region 125, where such a region can be a highly doped region to provide a conduction path, with relatively low resistance, between source/drain region 120-2-1 and conductive region 125.

Body contact 117 contacts channel structure 115-1 of transistor 105-1 and channel structure 115-2 of transistor 105-2. Body contact 117 is separated from conductive region 125 by a dielectric region 136. Body contact 117 can be located at various positions above the bottom end source/drain regions 120-1-1 and 120-2-1, with body contact 117 sufficiently separated from source/drain regions 120-1-1 and 120-2-1 and conductive region 125. Body contact 117 can have a vertical length in the range from about 2 nm to about 40 nm, with the pillars having a vertical length ranging from about 70 nm to about 200 nm. Other lengths can be implemented.

A conductive shield 112 can be located between channel structure 115-1 of transistor 105-1 and channel structure of transistor 105-2 and on and contacting body contact 117. Conductive shield 112 can be a metal or a metallic composition and can be connected to a constant voltage supply. Conductive shield 112 can be separated from channel structure 115-1 by a shield dielectric 132-1 and can be separated from channel structure 115-2 by a shield dielectric 132-2. The material composition of shield dielectric 132-1 can be the same as or different from the material composition of shield dielectric 132-2. In addition, the material compositions of shield dielectric 132-1 and shield dielectric 132-2 can be the same as or different from the material composition of gate dielectric 130-1 and gate dielectric 130-2. Further, an isolation dielectric 134 can be implemented in which transistors 105-1 and 105-2 can be structured. Various dielectric materials that can be used include, but are not limited to, silicon oxide, silicon nitride, silicon oxynitride, other appropriate dielectrics or combinations of dielectrics. The choice of dielectric materials for each of these regions can be selected based of the application for which transistors 105-1 and 105-2 are implemented or based on the efficiencies provided in the fabrication process flow.

Body contact 117 can be structured as a conductive body. For example, body contact 117 can be a p-type structure with channel structure 115-1 and channel structure 115-2 being p-type channel structures. Body contact 117 is contacted below conductive shield 112 and can be shorted to conductive shield 112. With conductive shield 112 contacted to a negative constant voltage with respect to gates 110-1 and 110-2, holes can be extracted from channel structure 115-1 and channel structure 115-2 via body contact 117 shorted to conductive shield 112, mitigating FBE. With conductive shield 112 being a metallic composition, an effective body line, provided by body contact 117 and conductive shield 112, is a low resistance path compared to other schemes.

The arrangement of two transistors 105-1 and 105-2 with a body contact 117 can be implemented in a memory device with each of two transistors 105-1 and 105-2 being part of two different memory cells coupled to the same data line. The data line can be realized by conductive region 125. In a memory array of such a memory device, gate 110-1 of transistor 105-1 and gate 110-2 of transistor 105-2 are coupled to different access lines. Conductive shield 112 structured with body contact 117 in the memory array can serve a dual purpose of mitigating adjacent access line disturb and mitigating FBE.

Figure 2:
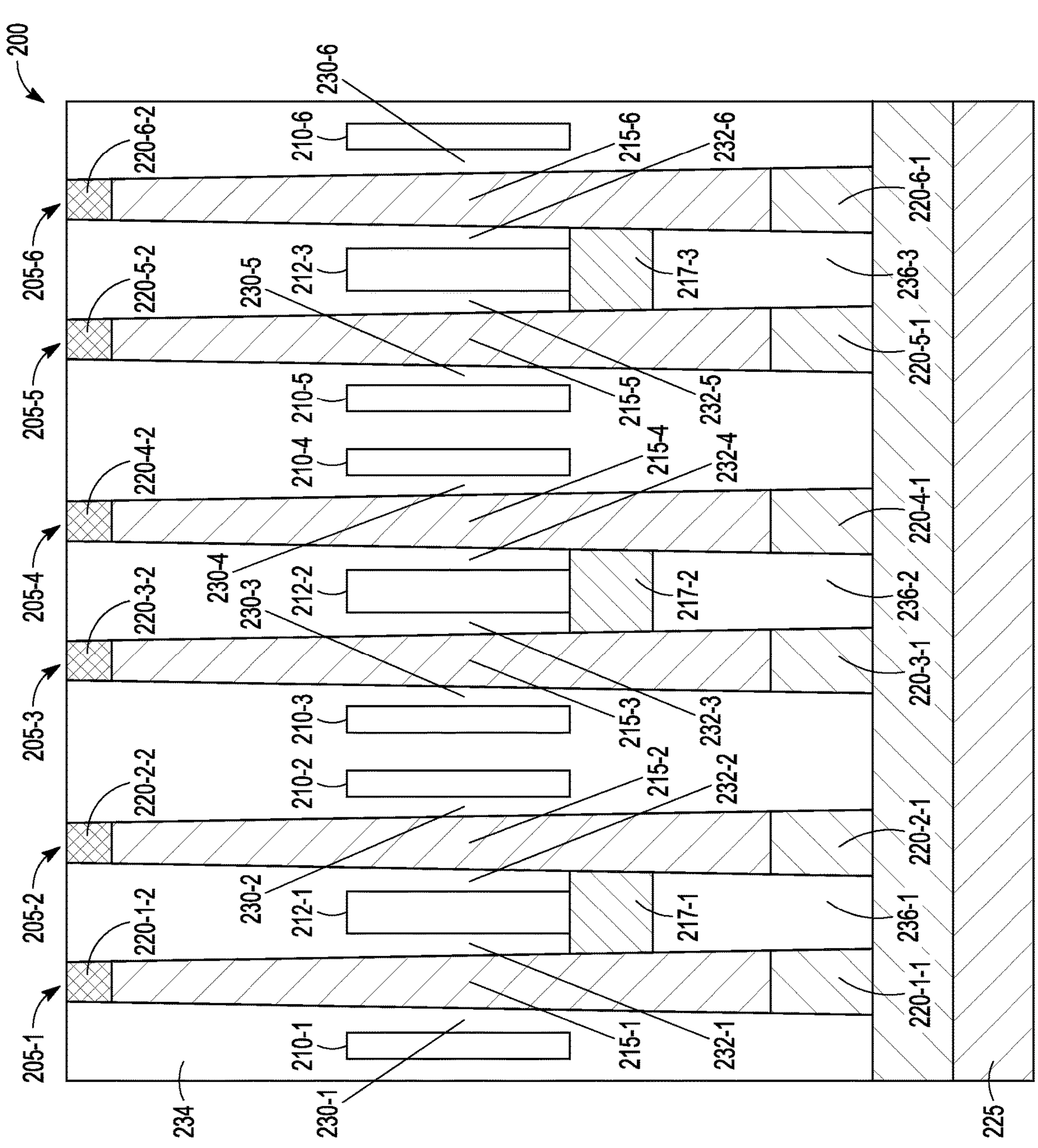
FIG. 2 illustrates a cross-sectional representation of an example of pairs of vertical transistors with a body contact structured between and contacting the two vertical transistors of each of the pairs in a memory device, according to various embodiments.

FIG. 2 illustrates a cross-sectional representation of an embodiment of an example of pairs of vertical transistors with a body contact structured between and contacting the two vertical transistors of each of the pairs in a memory device 200. Memory device 200 can include a pair having transistors 205-1 and 205-2, a pair having transistors 205-3 and 205-4, and a pair having transistors 205-5 and 205-6, with all the transistors on and coupled to a data line 225. Transistors 205-1, 205-2, 205-3, 205-4, 205-5 and 205-6 can be structured as access devices to storage elements of different memory cells. The storage elements can be capacitors. The capacitors can be realized in a number of different formats. Though transistors 205-1, 205-2, 205-3, 205-4, 205-5 and 205-6 are coupled to the same data line 225, each one of transistors 205-1, 205-2, 205-3, 205-4, 205-5 and 205-6 are coupled to an access line at their respective gates, where each access line is different for the different transistors. Each one of transistors 205-1, 205-2, 205-3, 205-4, 205-5 and 205-6 can be structured as a TFT with a single gate. Though three pairs of transistors defining six memory cells coupled to one data line are shown in FIG. 2, memory device 200 can include more than six memory cells coupled to one data line and more than one data line structured in the same manner.

The access transistors of memory device 200 can be structured in design and with materials similar to transistors 105-1 and 105-2 with a body contact 117 structured between and contacting the two transistors 105-1 and 105-2, as shown in FIG. 1. Transistors 205-1, 205-2, 205-3, 205-4, 205-5 and 205-6 can include source/drain regions 220-1-1 and 220-1-2, source/drain regions 220-2-1 and 220-2-2, source/drain regions 220-3-1 and 220-3-2, source/drain regions 220-4-1 and 220-4-2, source/drain regions 220-5-1 and 220-5-2, and source/drain regions 220-6-1 and 220-6-2, respectively, at opposite ends of different pillars that provide channel structures 215-1, 215-2, 215-3, 215-4, 215-5, and 215-6, respectively. Transistors 205-1, 205-2, 205-3, 205-4, 205-5 and 205-6 can include a single gate 210-1, 210-2, 210-3, 210-4, 210-5 and 210-6, respectively, separated from channel structures 215-1, 215-2, 215-3, 215-4, 215-5, and 215-6 by gate dielectrics 230-1, 230-2, 230-3, 230-4, 230-5, and 230-6, respectively. Transistors 205-1, 205-2, 205-3, 205-4, 205-5 and 205-6 are separated from each other by a dielectric region 234 that provides isolation for these transistors. Each gate of gates 210-1, 210-2, 210-3, 210-4, 210-5 and 210-6 can individually be structured as part of an individual access line or coupled to the individual access line.

The pair of transistors 205-1 and 205-2 are connected to a conductive body contact 217-1, where conductive body contact 217-1 contacts channel structure 215-1 of transistor 205-1 and channel structure 215-2 of transistor 205-2. Conductive body contact 217-1 is separated from data line 225 by a dielectric region 236-1. Conductive body contact 217-1 can be located below and contacting or shorted to a conductive shield 212-1, where conductive shield 212-1 can be coupled to a node (not shown in the cross-sectional view of FIG. 2) to receive a voltage. Memory device 200 can be structured to provide a constant voltage to the node. Conductive shield 212-1 can be located between channel structure 215-1 of transistor 205-1 and channel structure 215-2 of transistor 205-2, where a shield dielectric 232-1 separates conductive shield 212-1 from channel structure 215-1 and a shield dielectric 232-2 separates conductive shield 212-1 from channel structure 215-2.

The pair of transistors 205-3 and 205-4 are connected to a conductive body contact 217-2, where conductive body contact 217-2 contacts channel structure 215-3 of transistor 205-3 and channel structure 215-4 of transistor 205-4. Conductive body contact 217-2 is separated from data line 225 by a dielectric region 236-2. Conductive body contact 217-2 can be located below and contacting or shorted to a conductive shield 212-2, where conductive shield 212-2 can be coupled to a node (not shown in the cross-sectional view of FIG. 2) to receive a voltage. Memory device 200 can be structured to provide a constant voltage to the node. Conductive shield 212-2 can be located between channel structure 215-3 of transistor 205-3 and channel structure 215-4 of transistor 205-4, where a shield dielectric 232-3 separates conductive shield 212-2 from channel structure 215-3 and a shield dielectric 232-4 separates conductive shield 212-2 from channel structure 215-4.

The pair of transistors 205-5 and 205-6 are connected to a conductive body contact 217-3, where conductive body contact 217-3 contacts channel structure 215-5 of transistor 205-5 and channel structure 215-6 of transistor 205-6. Conductive body contact 217-3 is separated from data line 225 by a dielectric region 236-3. Conductive body contact 217-3 can be located below and contacting or shorted to a conductive shield 212-3, where conductive shield 212-3 can be coupled to a node (not shown in the cross-sectional view of FIG. 2) to receive a voltage. Memory device 200 can be structured to provide a constant voltage to the node. Conductive shield 212-3 can be located between channel structure 215-5 of transistor 205-5 and channel structure 215-6 of transistor 205-6, where a shield dielectric 232-5 separates conductive shield 212-3 from channel structure 215-5 and a shield dielectric 232-6 separates conductive shield 212-3 from channel structure 215-6.

Using TFT having a single gate opposite a vertical channel can be implemented in the array of memory device 200 to provide increased capacity. The increased capacity can be attained by scaling, taking into consideration the effects of the scaling, to reduce the size of the memory cells of the array. The transistors can be structured to provide a $4F^2$ memory cell. Mitigation of FBEs associated with the memory cells can be provided by the structure of these transistors of memory device 200 using a conductive body, contacting channel structures of transistors in a pair-wise arrangement, shorted to a conductive shield between the transistors with the conductive shield connected to a node that can be used to set the conductive shield to a constant voltage.

Figure 3:
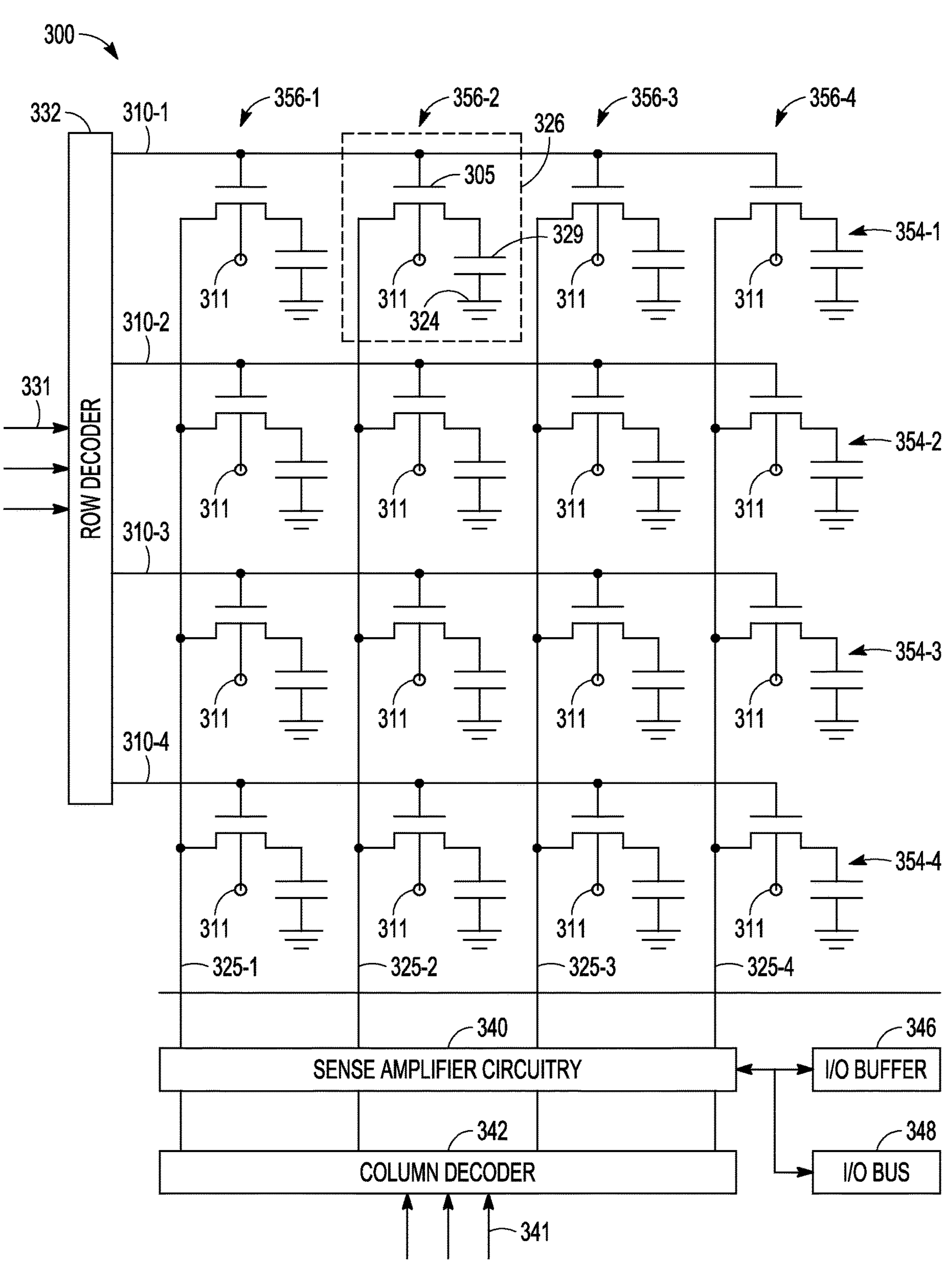
FIG. 3 is a schematic of an example dynamic random-access memory device that can include an arrangement similar to the arrangement of the memory device of FIG. 2, according to various embodiments.

FIG. 3 is a schematic of an example DRAM device 300 that can include an arrangement similar to the arrangement of memory device 200 of FIG. 2. DRAM device 300 includes an array of memory cells 326 (only one being labeled in FIG. 3 for ease of presentation) arranged in rows 354-1, 354-2, 354-3, and 354-4 and columns 356-1, 356-2, 356-3, and 356-4. For simplicity and ease of discussion, the array is shown in only two dimensions, but the array can be extended into the third dimension. Further, while only four rows 354-1, 354-2, 354-3, and 354-4 and four columns 356-1, 356-2, 356-3, and 356-4 of four memory cells are illustrated, DRAM devices like DRAM device 300 can have significantly more memory cells 326 (e.g., tens, hundreds, or thousands of memory cells) per row or per column.

Each memory cell 326 can include a single transistor 305 and a single capacitor 329, which is commonly referred to as a 1T1C (one-transistor—one capacitor cell). Transistor 305 can be implemented as a TFT having one-gate. One plate of capacitor 329, which can be termed the "node plate," is connected to the drain terminal of transistor 305, whereas the other plate of the capacitor 329 is connected to ground 324. Each capacitor 329 within the array of 1T1C cells 326 typically serves to store one bit of data, and the respective transistor 305 serves as an access device to write to or read from storage capacitor 329.

The transistor gate terminals within each row of rows 354-1, 354-2, 354-3, and 354-4 are portions of respective access lines 310-1, 310-2, 310-3, and 310-4 (alternatively referred to as "word lines"), and the transistor source terminals within each of columns 356-1, 356-2, 356-3, and 356-4 are electrically connected to respective data lines 325-1, 325-2, 325-3, and 325-4 (alternatively referred to as "bit lines"). The pair of transistors coupled to access line 310-1 and access line 310-2, respectively, and to data line 310-1 can be structured, similar to transistors 205-1 and 205-2 of memory device 200, with a conductive shield coupled to a conductive body, where the conductive shield is connected to a node 311 to receive a voltage that DRAM device 300 can set to a constant voltage in operation. The pair of transistors coupled to access line 310-3 and access line 310-4, respectively, and also to data line 310-1 can be structured, similar to transistors 205-3 and 205-4 of memory device 200, with a conductive shield coupled to a conductive body, where the conductive shield is connected to a node 311 to receive a voltage that DRAM device can set to a constant voltage in operation. The other transistors of the memory array of DRAM device 300 can be structured in a similar pair-wise arrangement with a conductive shield coupled to a conductive body, where the conductive shield is connected to a node 311 to receive a voltage that DRAM device 300 can set to a constant voltage in operation. The nodes 311 can be individually connected to a voltage source in DRAM device 300 or one or more of the nodes 311 can be coupled together in DRAM device 300 to receive a voltage.

A row decoder 332 can selectively drive the individual access lines 310-1, 310-2, 310-3, and 310-4, responsive to row address signals 331 input to row decoder 332. Driving a given access line at a high voltage causes the access transistors within the respective row to conduct, thereby connecting the storage capacitors within the row to the respective data lines, such that charge can be transferred between the data lines and the storage capacitors for read or write operations. Both read and write operations can be performed via sense amplifier circuitry 340, which can transfer bit values between the memory cells 326 of the selected row of the rows 354-1, 354-2, 354-3, and 354-4 and input/output buffers 346 (for write/read operations) or external input/output data buses 348.

A column decoder 342 responsive to column address signals 341 can select which of the memory cells 326 within the selected row is read out or written to. Alternatively, for read operations, the storage capacitors 329 within the selected row can be read out simultaneously and latched, and the column decoder 342 can then select which latch bits to connect to the output data bus 348. Since read-out of the storage capacitors destroys the stored information, the read operation is accompanied by a simultaneous rewrite of the capacitor charge. Further, in between read/write operations, the capacitor charge is repeatedly refreshed to prevent data loss. Details of read/rewrite, write, and refresh operations are well-known to those of ordinary skill in the art.

DRAM device 300 may be implemented as an integrated circuit within a package that includes pins for receiving supply voltages (e.g., to provide the source and gate voltages for the transistors 305) and signals (including data, address, and control signals). FIG. 3 depicts DRAM device 300 in simplified form to illustrate basic structural components, omitting many details of the memory cells 326 and associated access lines 310-1, 310-2, 310-3, and 310-4 and data lines 325-1, 325-2, 325-3, and 325-4 as well as the peripheral circuitry. For example, in addition to the row decoder 332 and column decoder 342, sense amplifier circuitry 340, and buffers 346, DRAM device 300 can include further peripheral circuitry, such as a memory control unit that controls the memory operations based on control signals (provided, e.g., by an external processor), additional input/output circuitry, etc. Details of such peripheral circuitry are generally known to those of ordinary skill in the art and not further discussed herein.

In two-dimensional (2D) DRAM arrays, the rows 354-1, 354-2, 354-3, and 354-4 and columns 356-1, 356-2, 356-3, and 356-4 of memory cells 326 are arranged along a single horizontal plane (i.e., a plane parallel to the layers) of the semiconductor substrate, e.g., in a rectangular lattice with mutually perpendicular horizontal access lines 310-1, 310-2, 310-3, and 310-4 and data lines 325-1, 325-2, 325-3, and 325-4. In 3D DRAM arrays, the memory cells 326 are arranged in a 3D lattice that encompasses multiple vertically stacked horizontal planes corresponding to multiple device tiers of a multi-tier substrate assembly, with each device tier including multiple parallel rows of cells 326 whose transistor gate terminals are connected by horizontal access lines such as access lines 310-1, 310-2, 310-3, and 310-4. (A "device tier," as used herein, can include multiple layers (or levels) of materials, but forms the components of memory devices of a single horizontal tier of memory cells.) Data lines 325-1, 325-2, 325-3, and 325-4 extend vertically through all or at least a vertical portion of the multi-tier structure, and each of the data lines 325-1, 325-2, 325-3, and 325-4 connects to the transistor source terminals of respective vertical columns 356-1, 356-2, 356-3, and 356-4 of associated memory cells 326 at the multiple device tiers. This 3D configuration of memory cells enables further increases in bit density compared with 2D arrays.

Figure 4:
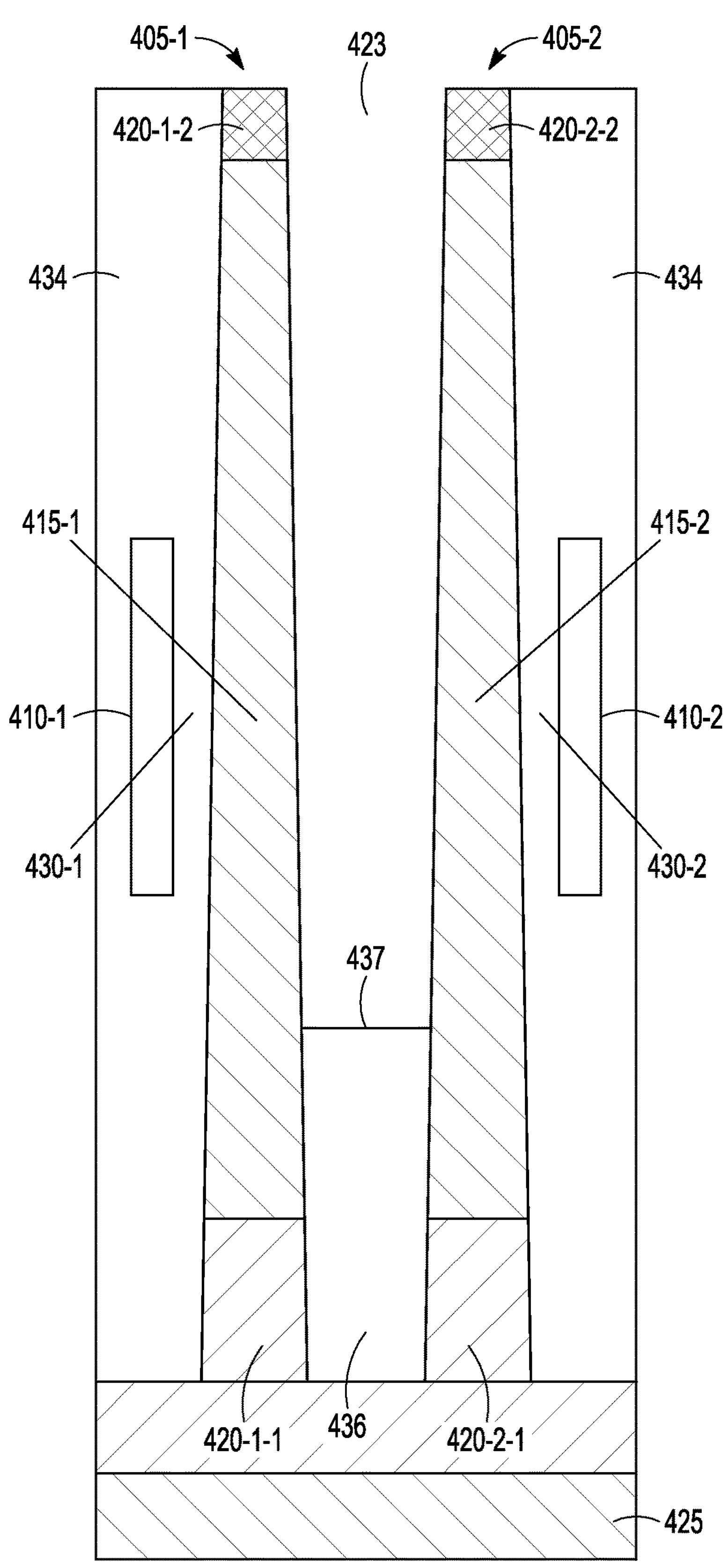
FIGS. 4-10 illustrate a process flow of an example method of forming a pair of one-gate vertical transistors with a conductive body shorted to a conductive shield, according to various embodiments.

FIGS. 4-10 illustrate a process flow of an embodiment of an example method of forming a pair of one-gate vertical transistors with a conductive body shorted to a conductive shield. FIG. 4 is a cross-sectional view after processing two transistors 405-1 and 405-2 above a conductive region 425 and forming a trench 423 between the two transistors 405-1 and 405-2. Transistor 405-1 has been formed as a TFT having a source/drain region 420-1-1 and a source/drain region 420-1-2 at opposite ends of a vertical pillar. Source/drain region 420-1-1 is at the bottom of the pillar and source/drain region 420-1-2 is at the top of the pillar. Source/drain region 420-1-1 and source/drain region 420-1-2 are highly doped regions relative to the material of the pillar between source/drain region 420-1-1 and source/drain region 420-1-2. The region of the pillar between source/drain region 420-1-1 and source/drain region 420-1-2 has been formed providing a channel structure 415-1 for transistor 405-1. Gate 410-1 is formed separated from channel structure 415-1 by a gate dielectric 430-1, where gate 410-1 has a metallic composition. The metallic composition can include one or more metals such as, but not limited to, tungsten or ruthenium. The metallic composition can include, but is not limited to, one or more of titanium nitride or a metal silicide. The vertical pillar can be formed having a doping that decreases from source/drain region 420-1-2 to a region opposite a gate 410-1 and then increases towards source/drain region 420-1-1. With source/drain region 420-1-1 and source/drain region 420-1-2 doped n-type, the pillar can be doped p-type. The pillar can include, but is not limited to, silicon, polysilicon, or silicon germanium. Source/drain region 420-1-1 is situated above conductive region 425. There can be a region between source/drain region 420-1-1 and conductive region 425, where such a region can be a highly doped region to provide a conduction path, with relatively low resistance, between source/drain region 420-1-1 and conductive region 425. Conductive region 425 can include one or more of tungsten, ruthenium, titanium nitride, a metal silicide, or other metallic composition.

Transistor 405-2 has been formed as a TFT having a source/drain region 420-2-1 and a source/drain region 420-2-2 at opposite ends of a vertical pillar. Source/drain region 420-2-1 is at the bottom of the pillar and source/drain region 420-2-2 is at the top of the pillar. Source/drain region 420-2-1 and source/drain region 420-2-2 are highly doped regions relative to the material of the pillar between source/drain region 420-2-1 and source/drain region 420-2-2. The region of the pillar between source/drain region 420-2-1 and source/drain region 420-2-2 has been formed providing a channel structure 415-2 for transistor 405-2. Gate 410-2 is formed separated from channel structure 415-2 by a gate dielectric 430-2, where gate 410-2 has a metallic composition. The metallic composition can include one or more metals such as, but not limited to, tungsten or ruthenium. The metallic composition can include, but is not limited to, one or more of titanium nitride or a metal silicide. The vertical pillar can be formed having a doping that decreases from source/drain region 420-2-1 to region opposite a gate 410-2 and then increases towards source/drain region 420-2-2. With source/drain region 420-2-1 and source/drain region 420-2-2 doped n-type, the pillar can be doped p-type. The pillar can include, but is not limited to, silicon, polysilicon, or silicon germanium. Source/drain region 420-2-1 is situated above conductive region 425. There can be a region between source/drain region 420-2-1 and conductive region 425, where such a region can be a highly doped region to provide a conduction path, with relatively low resistance, between source/drain region 420-2-2 and conductive region 425. Conductive region 425 can include one or more of tungsten, ruthenium, titanium nitride, a metal silicide, or other metallic composition.

Transistors 405-1 and 405-2 are formed in a dielectric region 434. Dielectric region 434 can be formed with the same or different material compositions of any one of gate dielectric 430-1 and gate dielectric 430-2. Various dielectrics that can be used include, but are not limited to, silicon oxide, silicon nitride, silicon oxynitride, other appropriate dielectrics or combinations of dielectrics. The choice of dielectric materials for each of these regions can be selected based of the application for which transistors 405-1 and 405-2 are implemented or based on the efficiencies provided in the fabrication process flow.

Dielectric region 434 or portions of dielectric region 434 can be formed after forming transistors 405-1 and 405-2. Trench 423 can be formed by removing portions of dielectric region 434 between transistors 405-1 and 405-2. Trench 423 has can be formed from at least the tops of transistors 405-1 and 405-2 down to a level 437 above conductive region 425, forming dielectric region 436 above conductive region 425. Trench 423 can be formed using an appropriate etching technique selected for the material of dielectric region 434.

Figure 5:
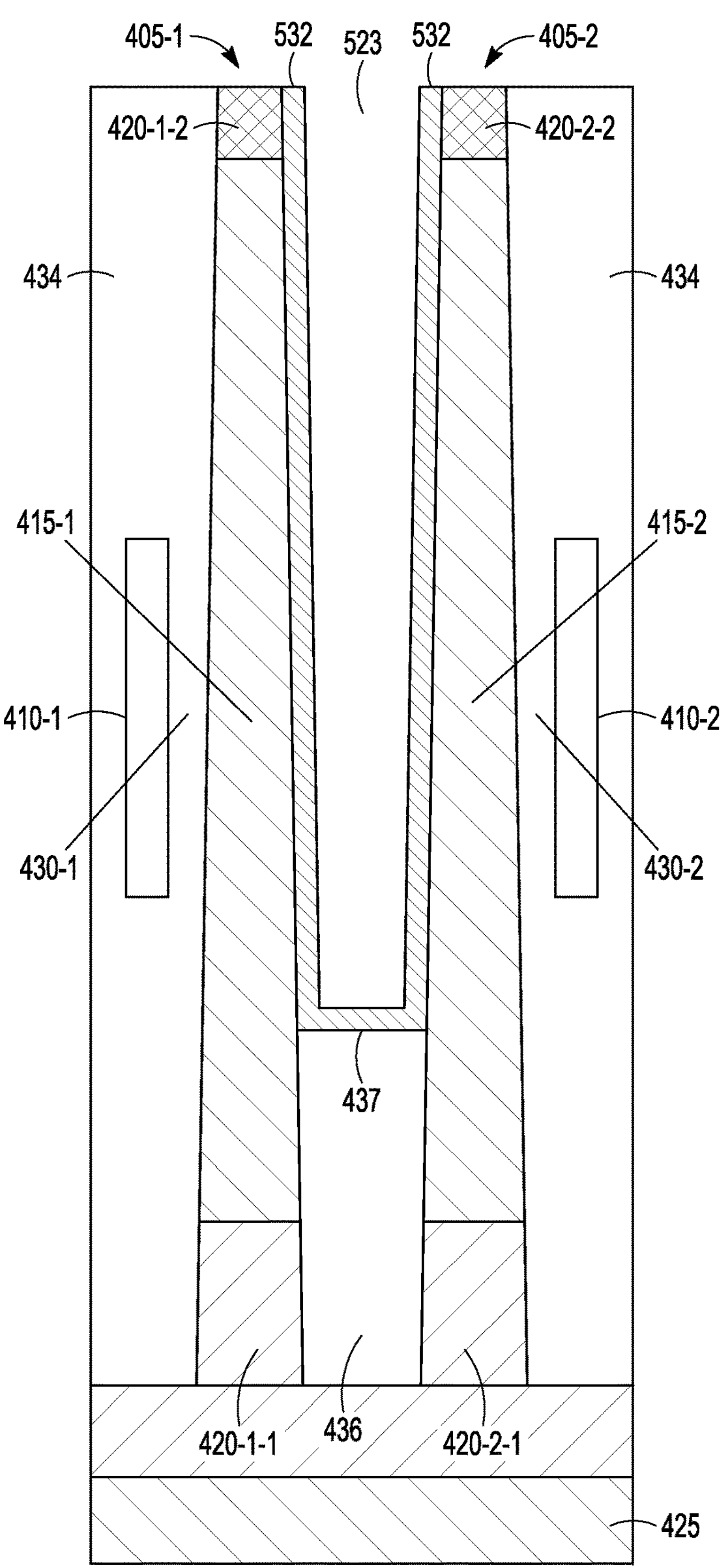

FIG. 5 is a cross-sectional view after further processing the structure of FIG. 4. A shield dielectric 532 has been formed in trench 423, reducing the opening of trench 423 to an opening 523. Shield dielectric 532 has been formed on the walls and the bottom of trench 423. Shield dielectric 532 can be, but is not limited to, an oxide or other appropriate dielectric material. The oxide can be, but is not, limited to silicon oxide. Shield dielectric 532 can be formed by a deposition technique appropriate for the material of shield dielectric 532.

Figure 6:
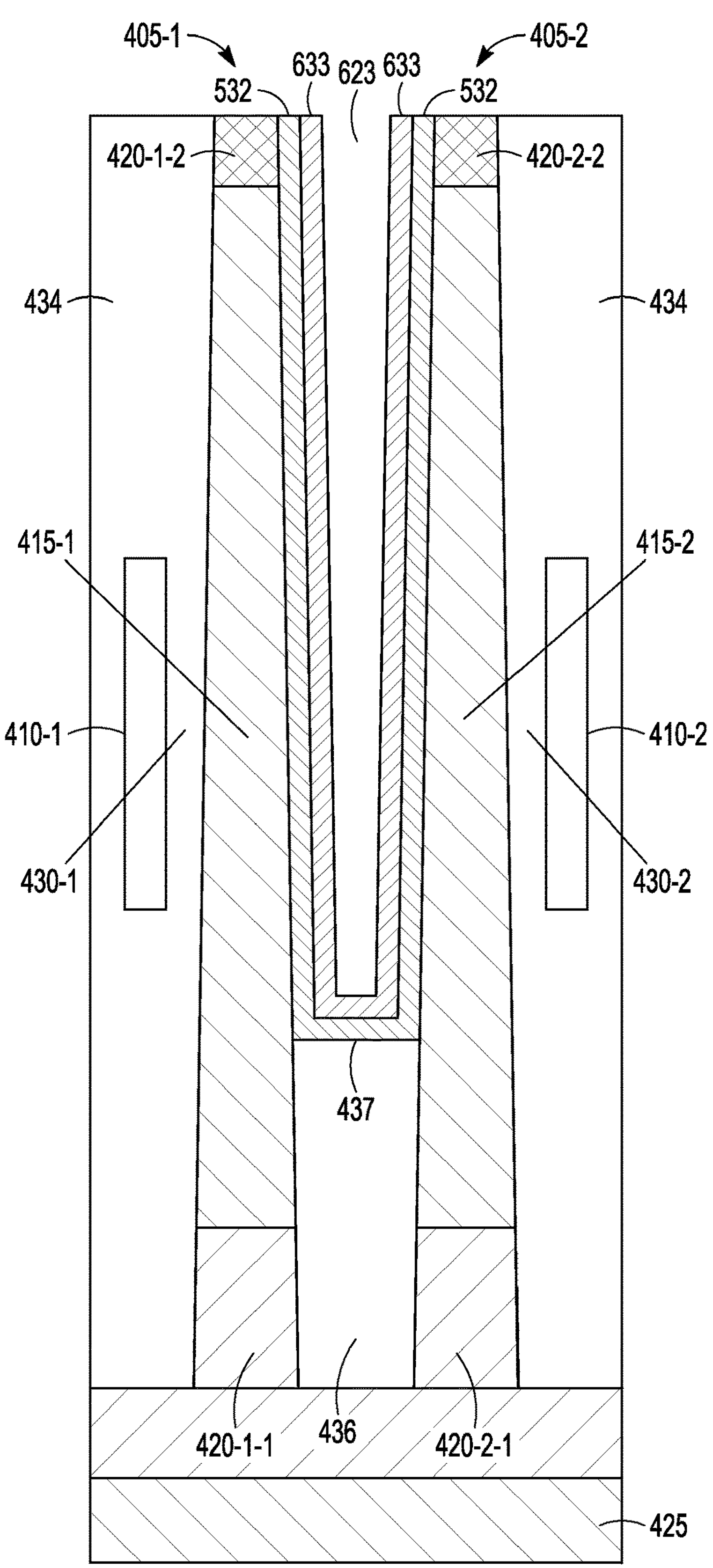

FIG. 6 is a cross-sectional view after further processing the structure of FIG. 5. A sacrificial dielectric 633 has been formed on shield dielectric 532, including the walls and the bottom of shield dielectric 532. Opening 523 of FIG. 5 has been reduced to an opening 623 of FIG. 6. Sacrificial dielectric 633 is used to provide protection to shield dielectric 532 in further processing. Sacrificial dielectric 633 can be a nitride that can later be removed.

Figure 7:
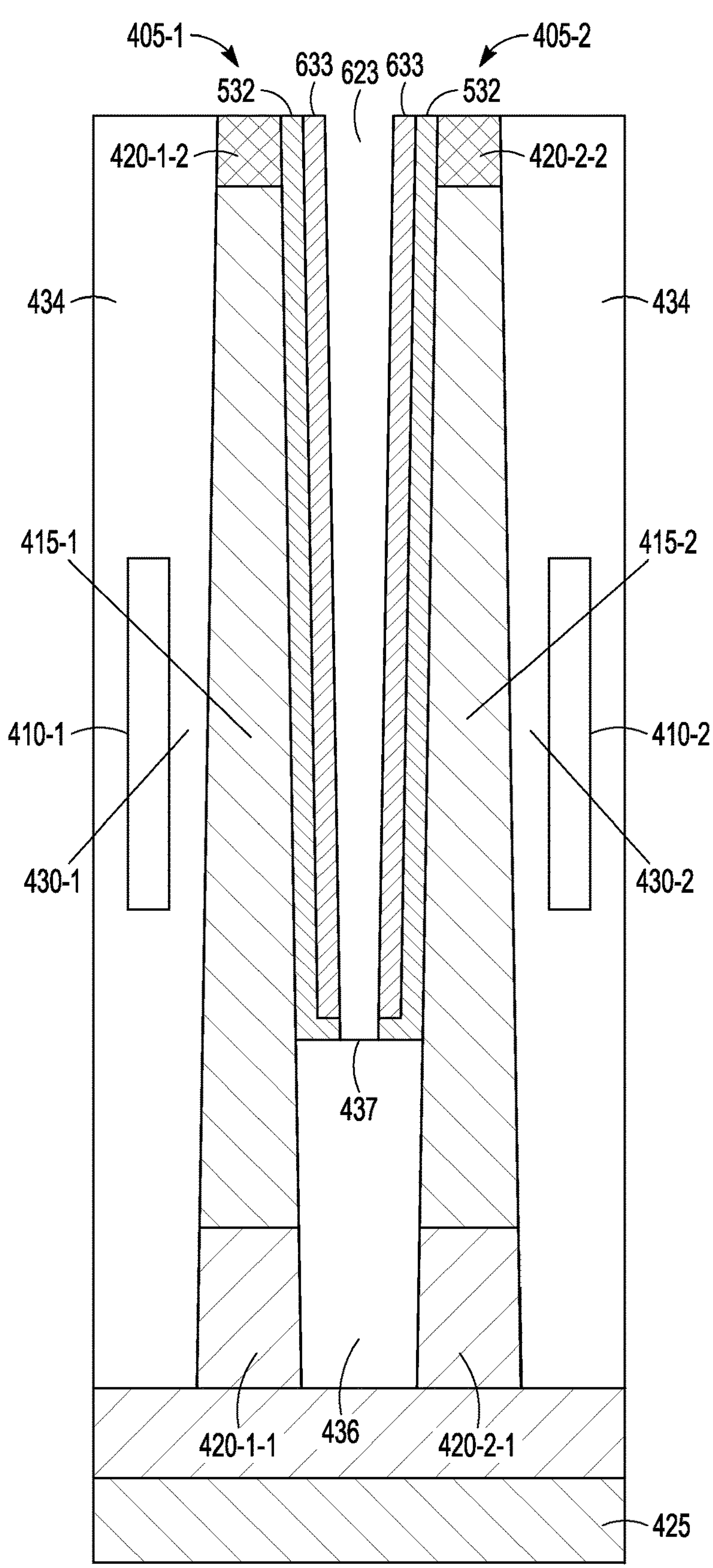

FIG. 7 is a cross-sectional view after further processing the structure of FIG. 6. A punch process has been implemented to create an opening in the bottom of sacrificial dielectric 633 and shield dielectric 532. The punch has changed opening 623 to opening 723 that exposes a portion of dielectric region 436 at level 437.

Figure 8:
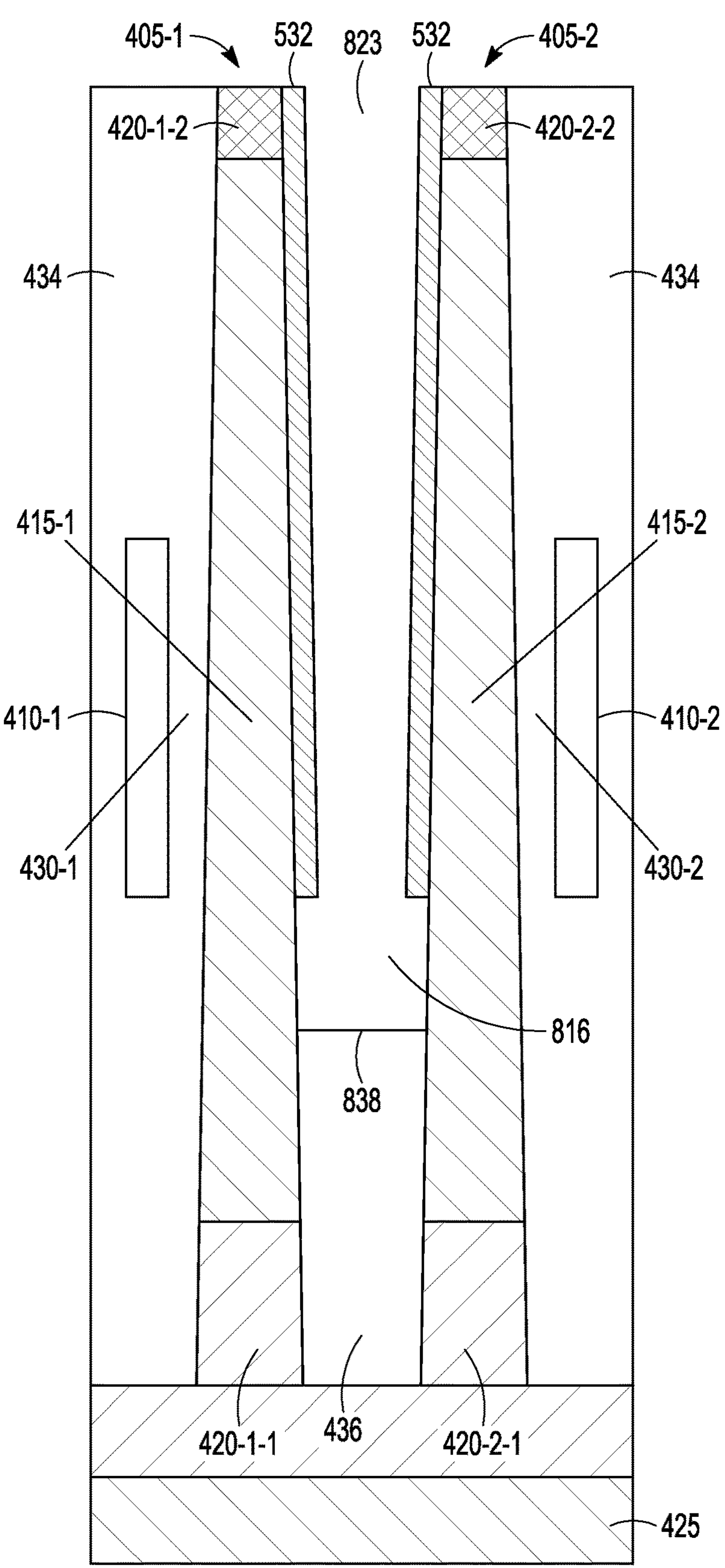

FIG. 8 is a cross-sectional view after further processing the structure of FIG. 7. Sacrificial dielectric 633 has been removed, forming opening 823. A portion of shield dielectric 532 has been removed at the bottom opening of opening 723 of FIG. 7 at the level 838 above conductive region 425 and extending upwards forming open region 816. Removing sacrificial dielectric 633 and forming open region 816 can be performed by selectively etching portions of shield dielectric 532 and exhuming sacrificial dielectric 633. In the process flow, forming shield dielectric 532 in a liner process can be synergetic with a process of forming a one-gate TFT with no extra mask used.

Figure 9:
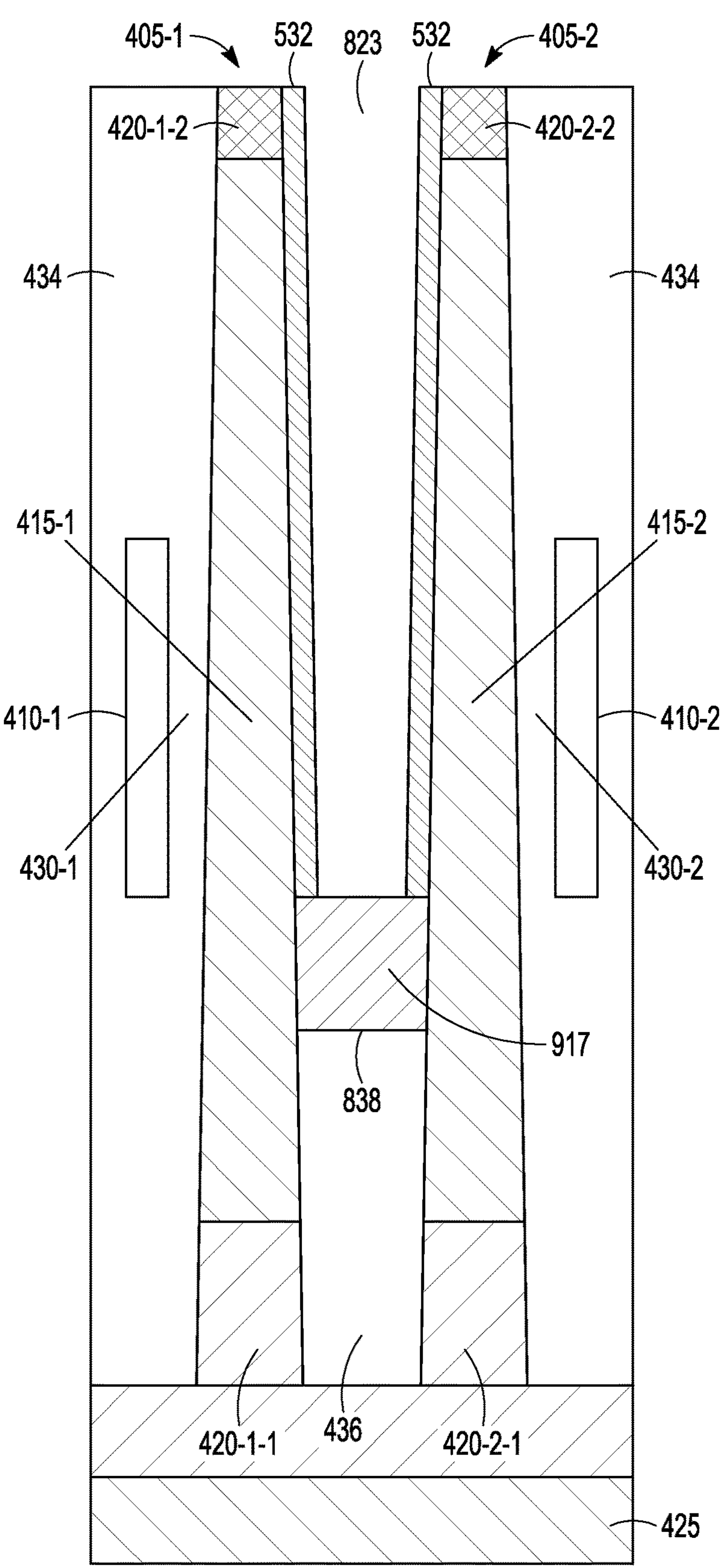

FIG. 9 is a cross-sectional view after further processing the structure of FIG. 8. Conductive material has been formed in open region 816 of FIG. 8, forming a conductive body 917 contacting channel structure 415-1 and channel structure 415-2. The selection of material for conductive body 917 can depend on the material of channel structures 415-1 and 415-2. The conductive material of conductive body 917 can be p-type material with the material of channel structures 415-1 and 415-2 being p-type material. Conductive body 917 can be formed using boron doped polysilicon.

Figure 10:
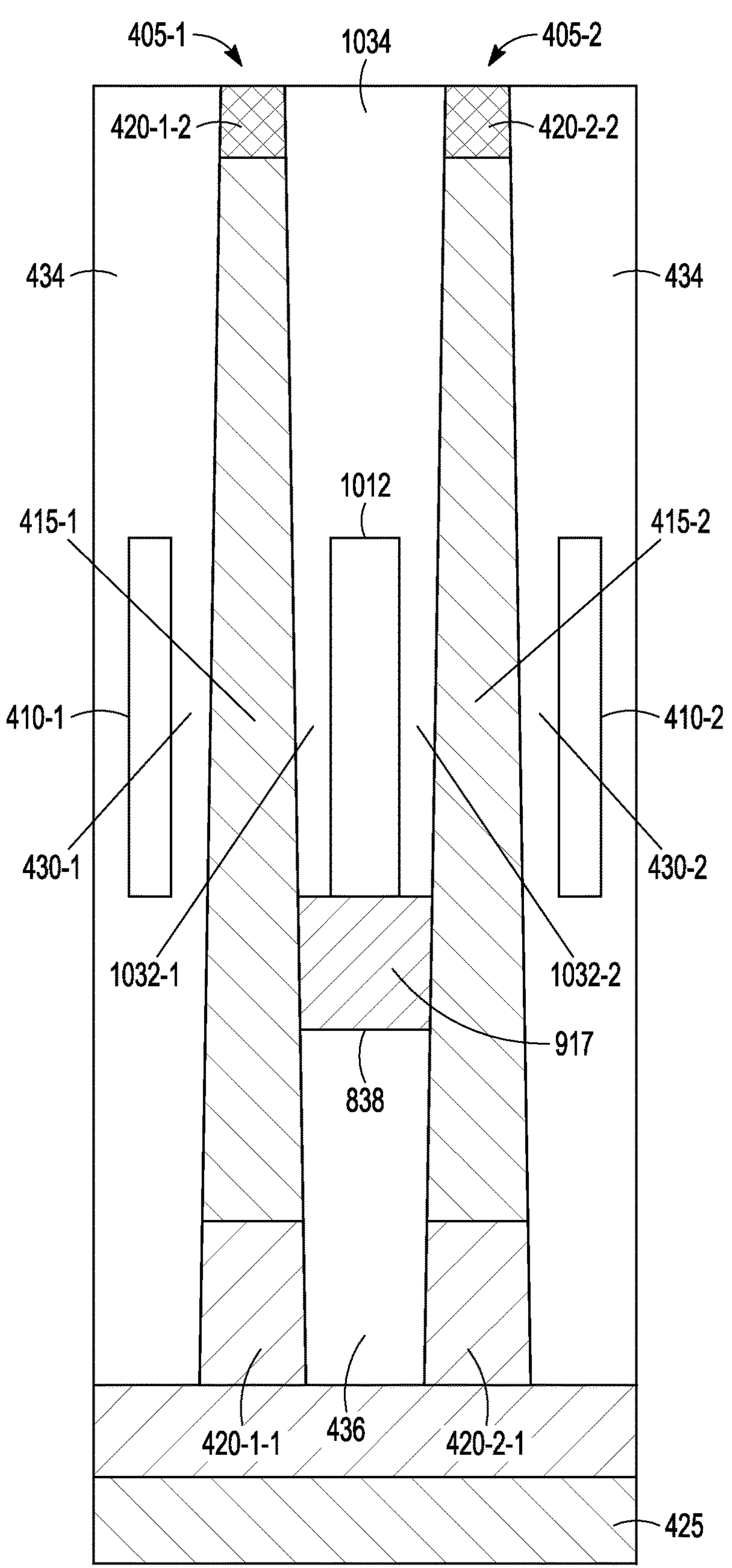

FIG. 10 is a cross-sectional view after further processing the structure of FIG. 9. A conductive shield 1012 has been formed such that conductive body 917 is shorted to conductive shield 1012. Conductive shield 1012 can be formed on and contacting conductive body 917. A shield dielectric 1032-1 has been formed separating conductive shield 1012 from channel structures 415-1. A shield dielectric 1032-2 has been formed separating conductive shield 1012 from channel structures 415-2. The formation of conductive shield 1012, shield dielectric 1032-1, and shield dielectric 1032-2 can be performed in a number of different ways. Shield dielectric 1032-1 and shield dielectric 1032-2 can be formed from previously formed shield dielectric 532. Material for shield dielectric 1032-1 and shield dielectric 1032-2 can be formed in opening 823 of FIG. 8, followed by creating an opening, forming the material for conductive shield 1012 in the newly created opening, and forming a dielectric 1034 on the conductive shield 1012. In another approach, material for conductive shield 1012 can be formed in opening 823 of FIG. 8, followed by forming shield dielectric 1032-1 and shield dielectric 1032-2 about conductive shield and dielectric 1034 on conductive shield 1012. Various dielectrics that can be used include, but are not limited to, silicon oxide, silicon nitride, silicon oxynitride, other appropriate dielectrics, or combinations of dielectrics. The choice of dielectric materials for each of the various regions of the structure of FIG. 10 can be selected based on the application for which transistors 405-1 and 405-2 are implemented or based on the efficiencies provided in the fabrication process flow.

Various deposition techniques for components in the process flow of FIGS. 4-10 can be used that are typical for the material being formed, the dimensions of the material being formed, and the architecture in which the material is being formed in the fabrication of the memory device. Material and structures can be formed by a suitable process such as, but not limited to, a deposition process including but not limited to physical vapor deposition (PVD), chemical vapor deposition (CVD), atomic layer depositon (ALD), or other deposition process. Other processes can be used. Selective etching can be used to remove selected regions in the processing discussed with respect to FIGS. 4-10. Selective etching is a process in which one or more materials are removed from a structure, while one or more other materials remain in the structure with no or little removal. Selective etching can depend on the material to be etched, the material not to be etched, the etchant employed, and the method for etching. Types of etching include wet etching and dry etching, where each of these two basic methods include a number of different etching procedures. In addtion, conventional masking techniques, providing protective regions in the processing, can be used in removal of selected regions in forming the components of the memory device.

Figure 11:
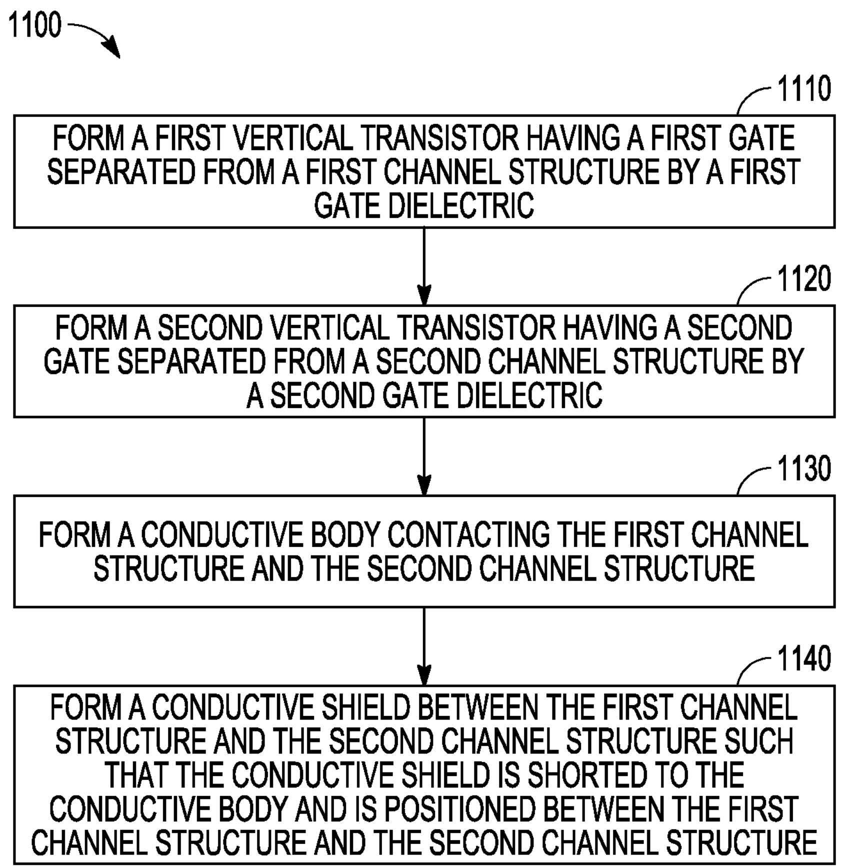
FIG. 11 is a flow diagram of features of an example method of forming an electronic device having a pair of one-gate vertical transistors with a conductive body shorted to a conductive shield, according to various embodiments.

FIG. 11 is a flow diagram of features of an embodiment of an example method 1100 of forming an electronic device having a pair of one-gate vertical transistors with a conductive body shorted to a conductive shield. In the following discussion of a pair of transistors, elements of one transistor of the pair are referenced as a first element and elements of the other transistor of the pair are referenced as a second element. At 1110, a first vertical transistor is formed. The first vertical transistor has a first gate separated from a first channel structure by a first gate dielectric. The first channel structure is between and contacts a first source/drain and a second source drain of the first vertical transistor. The first source/drain of the first vertical transistor can be coupled to a conductive line to pass a current between the conductive line and the second source/drain of the first vertical transistor via the first channel structure. The first source/drain of the first vertical transistor can contact the conductive line or can be coupled to the conductive line by a first contact structure. The second source/drain of the first vertical transistor can be coupled to a first electronic structure such as, but not limited to, a first capacitor. The second source/drain of the first vertical transistor can contact the first electronic structure or can be coupled to the first electronic structure by a second contact structure.

At 1120, a second vertical transistor is formed. The second vertical transistor has a first gate separated from a second channel structure by a second gate dielectric. The second channel structure is between and contacts a first source/drain and a second source drain of the second vertical transistor. The first source/drain of the second vertical transistor can be coupled to the conductive line to pass a current between the conductive line and the second source/drain of the second vertical transistor via the second channel structure. The first source/drain of the second vertical transistor can contact the conductive line or can be coupled to the conductive line by a first contact structure. The second source/drain of the second vertical transistor can be coupled to a second electronic structure such as, but not limited to, a second capacitor. The second source/drain of the second vertical transistor can contact the second electronic structure or can be coupled to the second electronic structure by a second contact structure.

At 1130, a conductive body is formed contacting the first channel structure and the second channel structure. The conductive body can be formed including polysilicon. At 1140, a conductive shield is formed between the first channel structure and the second channel structure such that the conductive shield is shorted to the conductive body. The conductive shield can be positioned between the first channel structure of the first vertical transistor and the second channel structure of the second vertical transistor. Forming the conductive shield can include forming a metallic composition. The metallic composition can be formed as one or more metals.

Variations of method 1100 or methods similar to method 1100 can include a number of different embodiments that may be combined depending on the application of such methods and/or the architecture of systems including an electronic device in which such methods are implemented. Such methods can include performing a number of procedures after forming the first vertical transistor and the second vertical transistor. A trench can be formed between the first vertical transistor and the second vertical transistor, where the trench ends on a dielectric region above a conductive line on which the first vertical transistor and the second vertical transistor are formed. A shield dielectric can be formed in the trench, leaving an opening in the trench. A sacrificial dielectric can be formed on the shield dielectric. The sacrificial dielectric and a portion of the shield dielectric can be removed, forming a second opening defined by the dielectric region above the conductive line, the first channel structure, and the second channel structure. The conductive body can be formed in the second opening such that the conductive body contacts the first channel structure and the second channel structure. Variations can include forming the conductive shield on the conductive body and contacting the shield dielectric. An isolation dielectric can be formed on the conductive shield and between the first vertical transistor and the second vertical transistor. The isolation dielectric can extend from a top of the conductive shield to the tops of the first vertical transistor and the second vertical transistor. The isolation dielectric can have the same composition as dielectrics structured about the first vertical transistor and the second vertical transistor providing electrical isolation for these transistors.

Method 1100 or methods similar to method 1100 can be used to form multiple pairs of transistors. For example, method 1100 or methods similar to method 1100 can be used to form multiple pairs of transistors in an array of a memory device. A conductive line on which selected pairs can be formed can be a data line of the memory device. Forming the array of memory cells of the memory device can include forming a number of sets of memory cells where each set of memory cells is coupled to a data line different from data lines coupled to the other sets of memory cells. Each set of the sets of memory cells can be arranged with transistors formed on a pair-wise basis in accordance with method 1100 or methods similar to method 1100. In an embodiment with the memory device formed as a DRAM device, each transistor of a set can be coupled to the data line assigned to the set and individually to a capacitor forming a memory cell. Each of the transistors of the pair forms a memory cell different from the memory cell formed by the other transistor of the pair. Though each of the transistors of the pair is coupled to the same data line, the transistors of the pair can be formed coupled to different access lines of the memory device.

In various embodiments, an electronic device can comprise one or more pairs of transistors arranged together. The pair of transistors of the electronic device can include a first vertical transistor having a first gate separated from a first channel structure by a first gate dielectric, and a second vertical transistor having a second gate separated from a second channel structure by a second gate dielectric. The electronic device can include a conductive shield positioned between the first channel structure and the second channel structure, and a conductive body shorted to the conductive shield and positioned between the first channel structure and the second channel structure. The conductive body contacts the first channel structure and the second channel structure. In various embodiments, the electronic device can be a memory device.

Variations of such an electronic device and its features, as taught herein, can include a number of different embodiments and features that can be combined depending on the application of such electronic devices, the format of such electronic devices, and/or the architecture in which such electronic devices are implemented. Features of such electronic devices can include the conductive body being situated below the conductive shield. In various embodiments, the conductive body can include polysilicon.

Variations can include the conductive shield having a metallic composition. The conductive shield can be a composition of one or more metals. Such metals can include, but are not limited to, tungsten or ruthenium. The conductive shield can be a metallic composition of one or more metals with one or more non-metal. Such a metallic composition can include, but is not limited to, one or more of titanium nitride, titanium silicide, tungsten silicide, or other metal silicide. The conductive shield can be separated from the first channel structure by a first dielectric region and is separated from the second channel structure by a second dielectric region. The first dielectric region and the second dielectric region can have a common composition. The common composition of the first dielectric region and the second dielectric region about the conductive shield can have the same composition as the first gate dielectric of the first vertical transistor and composition the second gate dielectric of the second vertical transistor. The conductive shield can be coupled to a voltage node. The conductive shield can be parallel to the first gate with the first gate being parallel to the second gate. The conductive shield can have a length equal to that of the first gate.

In various embodiments, a memory device can comprise data lines, access lines, and an array of memory cells, where the memory cells can be arranged having a first set of memory cells coupled to a first data line of the data lines and a second set of memory cells coupled to a second data line of the data lines. The first set of memory cells can include a first vertical transistor having a first gate separated from a first channel structure by a first gate dielectric, where the first vertical transistor is coupled to and extending from a first data line of the data lines, and a second vertical transistor having a second gate separated from a second channel structure by a second gate dielectric, where the second vertical transistor is coupled to and extending from the first data line. The first set of memory cells can include a conductive shield between the first channel structure and the second channel structure, and a conductive body shorted to the conductive shield and positioned between the first channel structure and the second channel structure, where the conductive body contacts the first channel structure and the second channel structure. The access lines can include a first access line coupled to the first gate and a second access line coupled to the second gate, the first access line being different from the second access line. The array of the memory device can include more than two sets of memory cells assigned to different individual data lines. The memory cells of this array, having more than two sets of memory cells, can be structured as memory cells arranged in pairs with respect to two transistors having a shield and conductive body between the two transistors, where the two transistors are coupled to different access lines.

Variations of such a memory device and its features, as taught herein, can include a number of different embodiments and features that can be combined depending on the application of such memory devices, the format of such memory devices, and/or the architecture in which such memory devices are implemented. Features of such memory devices can include the first vertical transistor being coupled to the first capacitor and the second vertical transistor being coupled to a second capacitor. Variations of such a memory device and its features can include the conductive body being below the conductive shield. In various embodiments, the conductive body can include polysilicon. The conductive shield can have a metallic composition. The conductive shield can be coupled to a voltage node.

Variations of such a memory device and its features can include one or more features of embodiments of electronic devices. Variations of such a memory device and its features can include features as taught herein or permutations of features as taught herein.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., Internet-of-Things (IoT) devices, etc.), have varying storage needs depending on, among other things, the type of electronic device, use environment, performance expectations, etc. Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, a solid-state drive (SSD), a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc. As used herein, "processor device" means any type of computational circuit such as, but not limited to, a microprocessor, a microcontroller, a graphics processor, a digital signal processor (DSP), or any other type of processor or processing circuit, including a group of processors or multi-core devices.

Figure 12:
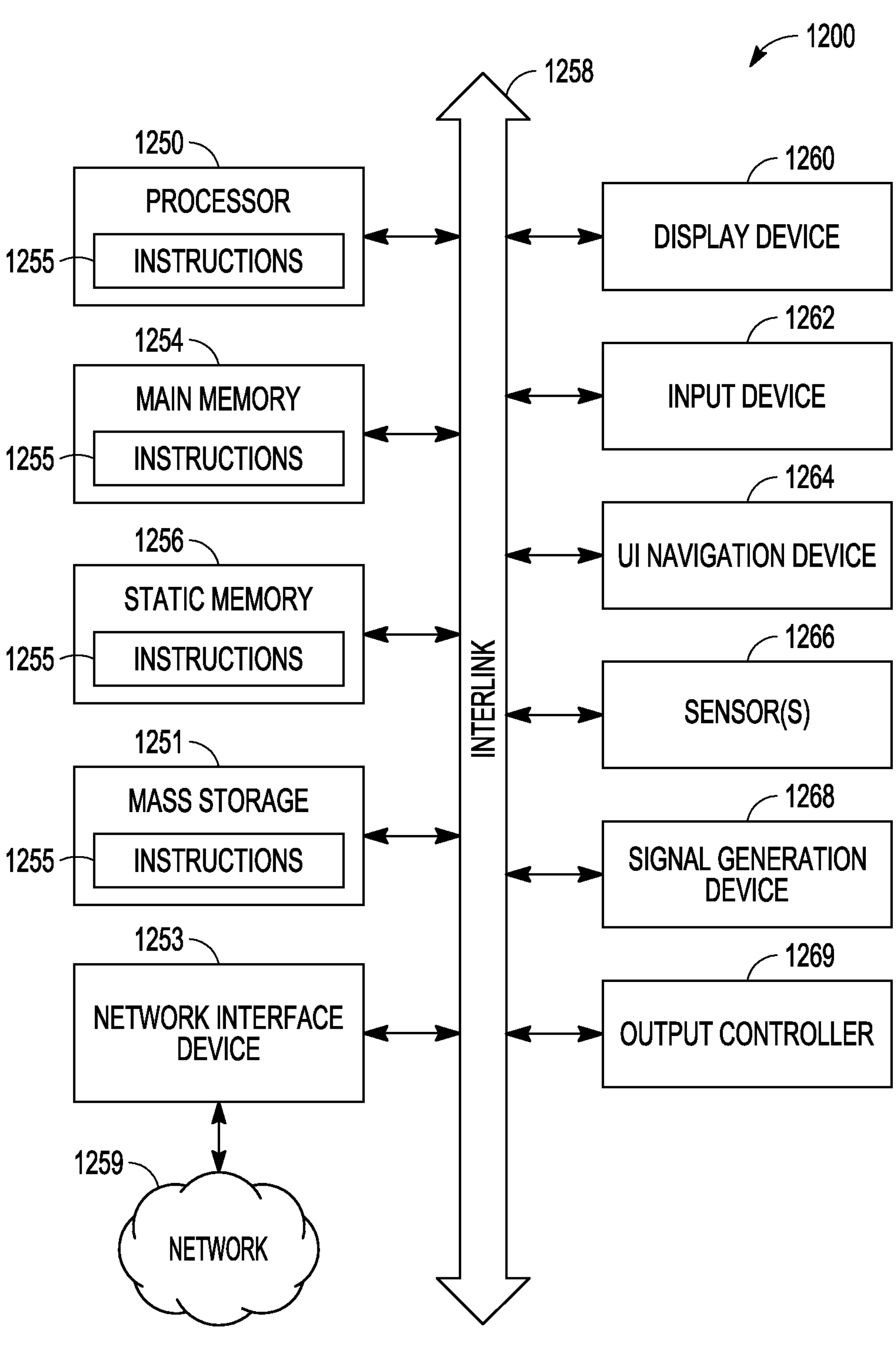
FIG. 12 is a block diagram illustrating an example of a machine that can be implemented with one or more devices having a pair of one-gate vertical transistors with a conductive body shorted to a conductive shield, according to various embodiments.

FIG. 12 illustrates a block diagram of an example machine 1200 having one or more embodiments of a machine that can be implemented with one or more devices having a pair of one-gate vertical transistors with a conductive body shorted to a conductive shield, as discussed herein. In alternative embodiments, machine 1200 can operate as a standalone device or can be connected (e.g., networked) to other machines. In a networked deployment, machine 1200 can operate in the capacity of a server machine, a client machine, or both in server-client network environments. In an example, machine 1200 can act as a peer machine in peer-to-peer (P2P) (or other distributed) network environment. Machine 1200 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer-readable medium physically modified (e.g., magnetically, electrically, moveable placement of invariant massed particles, etc.) to store instructions of the specific operation. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components can be used in more than one member of more than one circuitry.

The machine 1200 can include a hardware processor 1250 (e.g., a CPU, a GPU, a hardware processor core, or any combination thereof), a main memory 1254, and a static memory 1256, some or all of which can communicate with each other via an interlink 1258 (e.g., bus). Machine 1200 can further include a display device 1260, an input device 1262, which can be an alphanumeric input device (e.g., a keyboard), and a user interface (UI) navigation device 1264 (e.g., a mouse). In an example, display device 1260, input device 1262, and UI navigation device 1264 can be a touch screen display. Machine 1200 can additionally include a mass storage device (e.g., drive unit) 1251, a network interface device 1253, a signal generation device 1268, and one or more sensors 1266, such as a global positioning system (GPS) sensor, compass, accelerometer, or other sensor. Machine 1200 can include an output controller 1269, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Machine 1200 can include one or more machine-readable media on which is stored one or more sets of data structures or instructions 1255 (e.g., software, microcode, or other type of instructions) embodying or utilized by machine 1200 to perform any one or more of the techniques or functions for which machine 1200 is designed. The instructions 1255 can reside, completely or at least partially, within main memory 1254, within static memory 1256, or within hardware processor 1250 during execution thereof by machine 1200. In an example, one or any combination of hardware processor 1250, main memory 1254, static memory 1256, or mass storage device 1251 can constitute the machine-readable media on which is stored one or more sets of data structures or instructions. Various ones of hardware processor 1250, main memory 1254, static memory 1256, or mass storage device 1251 can include one or more devices having a pair of one-gate transistors with a conductive body shorted to a conductive shield, as discussed herein.

While an example machine-readable medium is illustrated as a single medium, the term "machine-readable medium" can include a single medium or multiple media (e.g., a centralized or distributed database, or associated caches and servers) configured to store instructions 1255 or data. The term "machine-readable medium" can include any medium that is capable of storing instructions for execution by machine 1200 and that cause machine 1200 to perform any one or more of the techniques to which machine 1200 is designed, or that is capable of storing data structures used by or associated with such instructions. Non-limiting machine-readable medium examples can include solid-state memories, optical media, and magnetic media. Specific examples of non-transitory machine-readable media can include: non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

Instructions 1255 (e.g., software, programs, an operating system (OS), etc.) or other data stored on mass storage device 1251 can be accessed by main memory 1254 for use by hardware processor 1250. Main memory 1254 (e.g., DRAM) is typically fast, but volatile, and thus a different type of storage than mass storage device 1251 (e.g., an SSD), which is suitable for long-term storage, including while in an "off" condition. Instructions 1255 or data in use by a user or machine 1200 are typically loaded in main memory 1254 for use by hardware processor 1250. When main memory 1254 is full, virtual space from mass storage device 1251 can be allocated to supplement main memory 1254; however, because mass storage device 1251 is typically slower than main memory 1254, and write speeds are typically at least twice as slow as read speeds, use of virtual memory can greatly reduce user experience due to storage device latency (in contrast to main memory 1254, e.g., DRAM). Further, use of mass storage device 1251 for virtual memory can greatly reduce the usable lifespan of mass storage device 1251.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, embedded MMC (eMMC™) devices are attached to a circuit board and considered a component of the host device, with read speeds that rival Serial Advanced Technology Attachment (SATA)-based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

Instructions 1255 can further be transmitted or received over a network 1259 using a transmission medium via signal generation device 1268 or network interface device 1253 utilizing any one of a number of transfer protocols (e.g., frame relay, Internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, signal generation device 1268 or network interface device 1253 can include one or more physical jacks (e.g., Ethernet, coaxial, or phone jacks) or one or more antennas to connect to network 1259. In an example, signal generation device 1268 or network interface device 1253 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions to and for execution by machine 1200 or data to or from machine 1200, and can include instrumentalities to propagate digital or analog communications signals to facilitate communication of such instructions, which instructions may be implemented by software or data.

The following are example embodiments of devices and methods, in accordance with the teachings herein.

An example electronic device 1 can comprise: a first vertical transistor having a first gate separated from a first channel structure by a first gate dielectric; a second vertical transistor having a second gate separated from a second channel structure by a second gate dielectric; a conductive shield between the first channel structure and the second channel structure; and a conductive body shorted to the conductive shield and positioned between the first channel structure and the second channel structure, the conductive body contacting the first channel structure and the second channel structure.

An example electronic device 2 can include features of example electronic device 1 and can include the conductive body being below the conductive shield.

An example electronic device 3 can include features of any of the preceding example electronic devices and can include the conductive shield having a metallic composition.

An example electronic device 4 can include features of example electronic device 3 and any of the preceding example electronic devices and can include the conductive body including polysilicon.

An example electronic device 5 can include features of any of the preceding example electronic devices and can include the conductive shield being separated from the first channel structure by a first dielectric region and is separated from the second channel structure by a second dielectric region.

An example electronic device 6 can include features of example electronic device 5 and any of the preceding example electronic devices and can include the first dielectric region and the second dielectric region having a common composition.

An example electronic device 7 can include features of example electronic device 6 and any of the preceding example electronic devices and can include composition of the first gate dielectric and composition the second gate dielectric are the common composition of the first dielectric region and the second dielectric region.

An example electronic device 8 can include features of any of the preceding example electronic devices and can include the conductive shield being coupled to a voltage node.

An example electronic device 9 can include features of any of the preceding example electronic devices and can include the conductive shield being parallel to the first gate and the first gate being parallel to the second gate, the conductive shield having a length equal to that of the first gate.

In an example electronic device 10, any of the electronic devices of example electronic devices 1 to 9 may include electronic devices incorporated into an electronic apparatus further comprising a host processor and a communication bus extending between the host processor and the electronic device.

In an example electronic device 11, any of the electronic devices of example electronic devices 1 to 10 may be modified to include any structure presented in another of example electronic device 1 to 10.

In an example electronic device 12, any apparatus associated with the electronic devices of example electronic devices 1 to 11 may further include a machine-readable storage device configured to store instructions as a physical state, wherein the instructions may be used to perform one or more operations of the apparatus.

In an example electronic device 13, any of the electronic devices of example electronic devices 1 to 12 may be operated in accordance with any of the below example methods 1 to 9.

An example memory device 1 can comprise: data lines; an array of memory cells, the memory cells arranged having a first set of memory cells coupled to a first data line of the data lines and a second set of memory cells coupled to a second data line of the data lines, the first set including: a first vertical transistor having a first gate separated from a first channel structure by a first gate dielectric, the first vertical transistor coupled to and extending from a first data line of the data lines; a second vertical transistor having a second gate separated from a second channel structure by a second gate dielectric, the second vertical transistor coupled to and extending from the first data line; a conductive shield between the first channel structure and the second channel structure; and a conductive body shorted to the conductive shield and positioned between the first channel structure and the second channel structure, the conductive body contacting the first channel structure and the second channel structure; and access lines including a first access line coupled to the first gate and a second access line coupled to the second gate, the first access line being different from the second access line.

An example memory device 2 can include features of example memory device 1 and can include the conductive body being below the conductive shield.

An example memory device 3 can include features of any of the preceding example memory devices and can include the conductive shield having a metallic composition.

An example memory device 4 can include features of any of the preceding example memory devices and can include the conductive body including polysilicon.

An example memory device 5 can include features of any features of the preceding example memory devices and can include the conductive shield being coupled to a voltage node.

An example memory device 6 can include features of any of the preceding example memory devices and can include the first vertical transistor being coupled to a first capacitor and the second vertical transistor being coupled to a second capacitor.

In an example memory device 7, any of the memory devices of example memory devices 1 to 6 may include memory devices incorporated into an electronic memory apparatus further comprising a host processor and a communication bus extending between the host processor and the memory device.

In an example memory device 8, any of the memory devices of example memory devices 1 to 7 may be modified to include any structure presented in another of example memory device 1 to 7.

In an example memory device 9, any apparatus associated with the memory devices of example memory devices 1 to 8 may further include a machine-readable storage device configured to store instructions as a physical state, wherein the instructions may be used to perform one or more operations of the apparatus.

In an example memory device 10, any of the memory devices of example memory devices 1 to 9 may be formed in accordance with any of the methods of the below example methods 1 to 9.

An example method 1 can comprise: forming a first vertical transistor having a first gate separated from a first channel structure by a first gate dielectric; forming a second vertical transistor having a second gate separated from a second channel structure by a second gate dielectric; forming a conductive body contacting the first channel structure and the second channel structure; and forming a conductive shield between the first channel structure and the second channel structure such that the conductive shield is shorted to the conductive body and is positioned between the first channel structure and the second channel structure.

An example method 2 can include features of example method 1 and can after forming the first vertical transistor and the second vertical transistor: forming a trench between the first vertical transistor and the second vertical transistor, the trench ending on a dielectric region above a conductive line on which the first vertical transistor and the second vertical transistor are formed; forming a shield dielectric in the trench, leaving an opening in the trench; forming a sacrificial dielectric on the shield dielectric; removing the sacrificial dielectric and a portion of the shield dielectric, forming a second opening defined by the dielectric region above the conductive line, the first channel structure, and the second channel structure; and forming the conductive body in the second opening such that the conductive body contacts the first channel structure and the second channel structure.

An example method 3 can include features of example method 2 and any of the preceding example methods and can include forming the conductive shield includes forming the conductive shield on the conductive body and contacting the shield dielectric.

An example method 4 can include features of example method 3 and any of the preceding example methods and can include forming an isolation dielectric on the conductive shield and between the first vertical transistor and the second vertical transistor.

An example method 5 can include features of example method 4 and any of the preceding example methods and can include forming the conductive body includes forming polysilicon; and forming the conductive shield includes forming a metallic composition.

In an example method 6, any of the example methods 1 to 5 may be performed in forming an electronic memory apparatus further comprising a host processor and a communication bus extending between the host processor and the memory device.

In an example method 7, any of the example methods 1 to 6 may be modified to include operations set forth in any other of example methods 1 to 6.

In an example method 8, any of the example methods 1 to 7 may be implemented at least in part through use of instructions stored as a physical state in one or more machine-readable storage devices.

An example method 9 can include features of any of the preceding example methods 1 to 8 and can include performing functions associated with any features of example memory devices 1 to 10 and example electronic device 1 to 13.

An example machine-readable storage device 1 storing instructions, that when executed by one or more processors, cause a machine to perform operations, can comprise instructions to perform functions associated with any features of example memory devices 1 to 10 and example electronic device 1 to 13 or perform methods associated with any features of example methods 1 to 9.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. An electronic device comprising:

a first vertical transistor having a first gate separated from a first channel structure by a first gate dielectric, the first channel structure connecting a lower source/drain to an upper source/drain of the first vertical transistor;

a second vertical transistor having a second gate separated from a second channel structure by a second gate dielectric, the second channel structure connecting a lower source/drain to an upper source/drain of the second vertical transistor;

a conductive shield between the first channel structure and the second channel structure at a vertical level between the lower source/drains and the upper source/drains of the first and second vertical transistors; and a conductive body shorted to the conductive shield and positioned between the first channel structure and the second channel structure, the conductive body contacting the first channel structure above a bottom end of the lower source/drain of the first vertical transistor and contacting the second channel structure above a bottom end of the lower source/drain of the second vertical transistor.

2. The electronic device of claim 1, wherein the conductive body is below the conductive shield.

3. The electronic device of claim 1, wherein the conductive shield has a metallic composition.

4. The electronic device of claim 1, wherein the conductive body includes polysilicon.

5. The electronic device of claim 1, wherein the conductive shield is separated from the first channel structure by a first dielectric region and is separated from the second channel structure by a second dielectric region.

6. The electronic device of claim 5, wherein the first dielectric region and the second dielectric region have a common composition.

7. The electronic device of claim 6, wherein composition of the first gate dielectric and composition the second gate dielectric are the common composition of the first dielectric region and the second dielectric region.

8. The electronic device of claim 1, wherein the conductive shield is coupled to a voltage node.

9. An electronic device comprising:

a first vertical transistor having a first gate separated from a first channel structure by a first gate dielectric;

a second vertical transistor having a second gate separated from a second channel structure by a second gate dielectric;

a conductive shield between the first channel structure and the second channel structure; and a conductive body shorted to the conductive shield and positioned between the first channel structure and the second channel structure, the conductive body contacting the first channel structure and the second channel structure, wherein the conductive shield is parallel to the first gate and the first gate is parallel to the second gate, the conductive shield having a length equal to that of the first gate.

10. A memory device comprising:

data lines;

an array of memory cells, the memory cells arranged having a first set of memory cells coupled to a first data line of the data lines and a second set of memory cells coupled to a second data line of the data lines, the first set including:

a first vertical transistor having a first gate separated from a first channel structure by a first gate dielectric, the first channel structure connecting a lower source/drain to an upper source/drain of the first vertical transistor, the first vertical transistor coupled to and extending from a first data line of the data lines;

a second vertical transistor having a second gate separated from a second channel structure by a second gate dielectric, the second channel structure connecting a lower source/drain to an upper source/drain of the second vertical transistor, the second vertical transistor coupled to and extending from the first data line;

a conductive shield between the first channel structure and the second channel structure at a vertical level between the lower source/drains and the upper source/drains of the first and second vertical transistors; and a conductive body shorted to the conductive shield and positioned between the first channel structure and the second channel structure, the conductive body contacting the first channel structure above a bottom end of the lower source/drain of the first vertical transistor and contacting the second channel structure above a bottom end of the lower source/drain of the second vertical transistor; and access lines including a first access line coupled to the first gate and a second access line coupled to the second gate, the first access line being different from the second access line.

11. The memory device of claim 10, wherein the conductive body is below the conductive shield.

12. The memory device of claim 10, wherein the conductive shield has a metallic composition.

13. The memory device of claim 10, wherein the conductive body includes polysilicon.

14. The memory device of claim 10, wherein the conductive shield is coupled to a voltage node.

15. The memory device of claim 10, wherein the first vertical transistor is coupled to a first capacitor and the second vertical transistor is coupled to a second capacitor.

16. A method comprising:

forming a first vertical transistor having a first gate separated from a first channel structure by a first gate dielectric such that the first channel structure connects a lower source/drain to an upper source/drain of the first vertical transistor;

forming a second vertical transistor having a second gate separated from a second channel structure by a second gate dielectric such that the second channel structure connects a lower source/drain to an upper source/drain of the second vertical transistor;

forming a conductive body contacting the first channel structure above a bottom end of the lower source/drain of the first vertical transistor and contacting the second channel structure above a bottom end of the lower source/drain of the second vertical transistor; and forming a conductive shield between the first channel structure and the second channel structure such that the conductive shield is shorted to the conductive body and is positioned between the first channel structure and the second channel structure at a vertical level between the lower source/drains and the upper source/drains of the first and second vertical transistors.

17. A method comprising:

forming a first vertical transistor having a first gate separated from a first channel structure by a first gate dielectric;

forming a second vertical transistor having a second gate separated from a second channel structure by a second gate dielectric;

forming a conductive body contacting the first channel structure and the second channel structure; and forming a conductive shield between the first channel structure and the second channel structure such that the conductive shield is shorted to the conductive body and is positioned between the first channel structure and the second channel structure, wherein the method includes, after forming the first vertical transistor and the second vertical transistor:

forming a trench between the first vertical transistor and the second vertical transistor, the trench ending on a dielectric region above a conductive line on which the first vertical transistor and the second vertical transistor are formed;

forming a shield dielectric in the trench, leaving an opening in the trench;

forming a sacrificial dielectric on the shield dielectric;

removing the sacrificial dielectric and a portion of the shield dielectric, forming a second opening defined by the dielectric region above the conductive line, the first channel structure, and the second channel structure; and forming the conductive body in the second opening such that the conductive body contacts the first channel structure and the second channel structure.

18. The method of claim 17, wherein forming the conductive shield includes forming the conductive shield on the conductive body and contacting the shield dielectric.

19. The method of claim 16, wherein the method includes forming an isolation dielectric on the conductive shield and between the first vertical transistor and the second vertical transistor.

20. The method of claim 16, wherein:

forming the conductive body includes forming polysilicon; and forming the conductive shield includes forming a metallic composition.

* * * * *